(12) United States Patent
Vieillard et al.

(10) Patent No.: US 10,128,652 B2
(45) Date of Patent: Nov. 13, 2018

(54) STABILIZING A DC ELECTRICITY NETWORK

(75) Inventors: Sebastien Vieillard, La Chapelle Gauthier (FR); Pierre Magne, Beaumont (FR); Farid Meibody-Tabar, Villers les Nancy (FR); Babak Nahid-Mobarakeh, Villers les Nancy (FR); Serge Pierfederici, Velaine-en-Haye (FR)

(73) Assignees: LABINAL POWER SYSTEMS, Blagnac (FR); UNIVERSITE DE LORRAINE, Nancy (FR)

( * ) Notice: Subject to any disclaimer, the term of this patent is extended or adjusted under 35 U.S.C. 154(b) by 839 days.

(21) Appl. No.: 14/344,760

(22) PCT Filed: Sep. 12, 2012

(86) PCT No.: PCT/FR2012/052037
§ 371 (c)(1),
(2), (4) Date: Mar. 13, 2014

(87) PCT Pub. No.: WO2013/038105
PCT Pub. Date: Mar. 21, 2013

(65) Prior Publication Data
US 2014/0375128 A1 Dec. 25, 2014

(30) Foreign Application Priority Data

Sep. 14, 2011 (FR) .................................. 11 58205

(51) Int. Cl.
*H02J 3/14* (2006.01)
*H02J 1/00* (2006.01)
(Continued)

(52) U.S. Cl.
CPC ................. *H02J 1/00* (2013.01); *B60R 16/03* (2013.01); *G06F 17/10* (2013.01); *H02J 1/14* (2013.01);
(Continued)

(58) Field of Classification Search
CPC ........ H02J 1/00; H02J 1/14; H02J 3/16; H02J 3/24; H03H 7/0138; B60R 16/03;
(Continued)

(56) References Cited

U.S. PATENT DOCUMENTS

2009/0267588 A1 10/2009 Schmitz et al.

OTHER PUBLICATIONS

Author: Ehsan Jamshidpour et al.; Title: Distributed Stabilization in DC Hybrid Power System; Date of Conference: Sep. 6-9, 2011; Publisher: IEEE.*

(Continued)

*Primary Examiner* — Richard Tan
(74) *Attorney, Agent, or Firm* — Oblon, McClelland, Maier & Neustadt, L.L.P.

(57) ABSTRACT

A method of stabilizing a DC electricity network, the network including a DC voltage source powering electrical loads that are connected in parallel to terminals of the voltage source and each of which is to receive a current or voltage setpoint. The method stabilizes the network by regulating setpoints applied to the loads by a virtual stabilization impedance generated at terminals of each load, the virtual impedances being dimensioned to stabilize the network in desired operating points and in given configurations of the network including a state in which at least one load is inactive or has failed and a state in which the stabilization of a load is inactive. Each virtual impedance is generated by a non-linear regulation loop acting on the setpoint for the corresponding load.

9 Claims, 4 Drawing Sheets

(51) Int. Cl.
  *H02J 1/14* (2006.01)
  *H02J 3/16* (2006.01)
  *H02J 3/24* (2006.01)
  *B60R 16/03* (2006.01)
  *G06F 17/10* (2006.01)
  *H02M 3/02* (2006.01)
  *H03H 7/01* (2006.01)

(52) U.S. Cl.
  CPC .................. *H02J 3/16* (2013.01); *H02J 3/24* (2013.01); *H02M 3/02* (2013.01); *H03H 7/0138* (2013.01); *Y02E 40/34* (2013.01); *Y10T 307/43* (2015.04)

(58) Field of Classification Search
  CPC ........ G06F 17/10; H02M 3/02; Y10T 307/43; Y02E 40/34
  USPC .............................................. 307/31, 33, 34
  See application file for complete search history.

(56) References Cited

OTHER PUBLICATIONS

Author: Pierre Magne et al.; Title: DC-Link Voltage Large Signal Stabilization and Transient Control Using a Virtual Capacitor; Date of Conference: Oct. 3-7, 2010; Publisher: IEEE.*
Author: Ahmed-Bilal Awan et al.; Title: Active Stabilization of a Poorly Damped Input Filter Supplying a Constant Power Load; Date of Conference: Sep. 20-24, 2009 Publisher: IEEE.*
Author: Xinyun Liu et al.; Title: Active Stabilisation of an HVDC Distribution System with Multiple Constant Power Loads Date of Conference: Sep. 3-5, 2008 Publisher: IEEE.*
French Search Report dated Aug. 14, 2012 in French Application No. 1158205 Filed Sep. 14, 2011.
International Search Report dated Feb. 20, 2013 in PCT/FR12/52037 Filed Sep. 12, 2012.

* cited by examiner

STABILIZING A DC ELECTRICITY NETWORK

The invention relates to a method of stabilizing a direct current (DC) electricity network or subnetwork having a DC voltage bus, for example a high voltage direct current (HVDC) network or subnetwork. The network may be found on board transport means such as an aircraft or a road vehicle or it may power a building such as a factory. In the present application, the term "subnetwork" is used to mean a local network forming part of a larger electricity network.

A DC network or subnetwork typically comprises a DC voltage source powering a plurality of electrical loads, such as converters (e.g. of the type comprising an inverter, an actuator, a storage source (a supercapacitor), a permanent magnet synchronous machine, etc.), which loads are connected in parallel to the terminals of the voltage source and each of which is to receive a current or power setpoint. Each load may thus correspond to a different piece of equipment and need not necessarily have any communications link with the other loads, possibly having its own independent active load control.

A DC network or subnetwork differs from a distributed AC network by the increased importance of the constraint associated with ensuring that the DC network and its loads are stable. The loads together with the network itself should normally be dimensioned so that their respective impedances enable a stable network to be obtained.

A DC network is unstable at an operating point if the voltage or current signal at the terminals of its load oscillate with an amplitude that increases over time.

It is known to stabilize a network or a load in active manner or in passive manner.

Passive stabilization of a load of a network consists in dimensioning its impedance so as to satisfy the stability criteria of the network. This leads to significant overdimensioning of passive elements (resistors and capacitors) in the network so as to enable the network to be stable under various configurations. That solution is not always satisfactory since it can lead to an increase in the size and the weight of the network, where that constitutes a major problem when the network is to be an on-board network, in particular in an aircraft. Furthermore, it is possible that such overdimensioning does not comply with certain initially specified constraints, such as a cutoff frequency of a filter, for example. Furthermore, adding a load to such a network that is stabilized in passive manner can lead to the network becoming unstable, even if the load added to the network is itself stable. This shows that the stability of the loads on their own does not ensure that the network including these loads is stable, since the way the loads are interconnected via a common bus can lead to the network being unstable. Another passive technique for stabilizing a network is to ensure that the loads do not consume more than a certain amount of power from the network, by incorporating saturations for the reference setpoints of the load.

The article "Stabilization of constant power load by passive impedance damping" by Céspedes et al. in *Applied Power Electronics Conference and Exposition (APEC), 2010, twenty-sixth Annual IEEE Conference, pp.* 2174-2180 describes a method of passively stabilizing a load by adding a filter to the network, thereby increasing the damping of the DC bus and thus increasing its stability.

Active stabilization of the load on a dedicated network consists in modifying its control setpoint in order to increase the stability of the network. Nevertheless, that solution is limited since it applies to a simple network having only one load.

The article "Active stabilization of a poorly damped input filter supplying a constant power load" by Awan et al., in *Proc. ECCE'09* describes a method of actively stabilizing a load of a network, proposing specific state feedback based on the circle criterion. It is also known to stabilize a network having a plurality of loads in centralized manner. The network then has a stabilization member that acquires information about the entire network and that generates a vector containing stabilizing signals for each of the loads, thereby stabilizing the network as a whole.

The article "Active stabilization of an HVDC distribution system with multiple constant power loads" by Liu et al., *IEEE Trans. Industrial Electronics,* 2008, 54, No. 6 describes active stabilization of a load by implementing local stabilizers.

Nevertheless, none of the prior art solutions for actively stabilizing a load or an electricity network is entirely satisfactory, since it has been found that in the event of one of the loads of the network failing or in the event of the network being reconfigured, the network does not necessarily continue to be stabilized.

A particular object of the invention is to avoid those drawbacks in a manner that is simple, effective, and inexpensive.

The invention provides an active and decentralized stabilization method for a DC network or subnetwork.

To this end, the invention provides a method of stabilizing a DC electricity network, the network having a DC voltage source powering electrical loads that are connected in parallel to the terminals of the voltage source and each of which is to receive a current or voltage setpoint, the method being characterized in that the network is stabilized by regulating the setpoints applied to the loads by means of a virtual stabilization impedance generated at the terminals of each load, these virtual impedances being dimensioned so as to stabilize the network at various desired operating points and in various given configurations of the network including the state in which at least one load is inactive or has failed and the state in which the stabilization of a load is inactive, each virtual impedance being generated by means of a non-linear regulation loop acting on the setpoint for the corresponding load.

According to another characteristic of the invention, each virtual impedance is generated by means of a stabilization block of a non-linear regulation loop that acts on the setpoint of the corresponding load and that is suitable for generating a stabilization signal $p_v(t)$ for superposing on the setpoint of the load in order to raise the threshold of the setpoint beyond which the network is unstable, the stabilization signal being of the type:

$$p_v(t) = v_s(t) \cdot C_v \cdot dv_s/dt$$

or $$p_v(t) = K \cdot v_s^2 - X_3$$

where $v_s$ represents the voltage at the terminals of the load, $C_v$ and K are parameters defining the virtual stabilization impedance, and $X_3$ is the output signal from a filter of cutoff frequency $w_c$ that receives the signal $K \cdot v_s^2$ as input, increasing the parameter $C_v$ or K and increasing the stabilization signal, serves to raise the threshold of the setpoint of the load or the threshold of the maximum power consumed by the load, and guarantees stability of the network.

$C_v$ represents a virtual capacitance and K is a correction coefficient equivalent to 1/R, 1/K thus representing a virtual resistance. $C_v$ and K are thus parameters defining the virtual impedance generated at the terminals of the load.

In the invention, the DC network is stabilized by a decentralized approach by putting a multiblock stabilization system into place. The principle of this approach is to use a decentralized structure to put a multi-block stabilization system into place on the DC network. The system is made up of a plurality of independent local stabilization blocks installed on each load of the system. In this way, it is possible to damp the system in front of each load, thereby locally limiting sources of instability. This makes it possible to stabilize the network as a whole. The decentralized aspect of this approach contributes to making the system reliable. Each stabilization block is independent of the others and is arranged locally in the network, there being no need for any connections between them, and a failure of any one of them does not affect the others. Furthermore, it is possible to dimension the set of blocks in such a manner as to guarantee that the system remains stable under certain failure scenarios.

Preferably, each regulation loop uses a non-linear regulation relationship generating an output signal of the type K.f(x), where x is a control variable for the load and K is a correction coefficient specific to the load, the correction coefficients ($K_1, K_2, \ldots, K_n$) being determined by performing the steps consisting in:

a) defining a mathematical model of the electricity network, the model comprising equations including the above-mentioned correction coefficients ($K_1, K_2, \ldots, K_n$) for ensuring stability of the loads and of the network;

b) defining constraints to be satisfied so that the network remains stable, in particular in the event of the network being reconfigured or in the event of at least one load failing; and c) determining an optimum vector of correction coefficients by means of an optimization algorithm for verifying that a given vector satisfies the above-mentioned constraints and for calculating a target function for stabilizing the vector, and then in repeating these steps until obtaining a vector that satisfies the constraints to be satisfied.

The method of the invention makes it possible to ensure that a DC network or subnetwork is stabilized by stabilizing the loads of the network or subnetwork, and does so for defined operating points regardless of the configuration and/or the failures of the network. The stabilizing of each load takes account of the impact of each load on the stabilization of the network overall. The method of the invention makes it possible to avoid overdimensioning the passive elements of the network or to overdimension them to a small extent only by creating a virtual impedance (e.g. a capacitance or a resistance) upstream from each load, thereby enabling the loads to be stabilized and also enabling the overall network to be stabilized. The purpose of this virtual impedance is to damp disturbances that might be generated on the network or at the terminals of the load, and it is "dimensioned" in such a manner as to stabilize the network at its various desired operating points, in the various given network configurations, and in the event of at least one load failing (i.e. the load being deactivated or breaking down).

The virtual impedance generated at the terminals of each load is obtained by regulating the control setpoint of the load by means of a non-linear relationship and a predetermined correction coefficient. The vector comprising the optimum correction coefficient for all of the loads is determined so that the above-mentioned constraints are satisfied and a target function can be achieved.

By way of example, step a) may consist in defining a non-linear model of the network and in linearizing it around an operating point or in expressing its Jacobean.

The constraints to be satisfied in step b) may comprise acceptable ranges of values for the correction coefficients and for maintaining stabilization in the event of the network being reconfigured, in the event of a failure in the stabilization of at least one load, and given variations or inaccuracies in the parametric values specific to the network.

Taking account of variations or inaccuracies in the parametric values specific to the network makes it possible to define a robustness margin and a safety margin for the stability.

Advantageously, the mathematical model includes equations characterizing the network in the absence of one or more loads and/or in the absence of stabilization for one or more loads.

The stabilization is thus robust against breakdowns and reconfigurations of the network without identifying the configuration in real time and without modifying the regulation/stabilization parameters used.

By way of example, the optimization algorithm used in step c) may serve to compare the calculation of the target function using a vector with the calculation of the same function using another vector in which the correction coefficients are the smallest possible, and then in repeating these steps until the vector under consideration minimizes the defined target function. This is selected in such a manner as to direct efforts for stabilizing the network in the manner desired by a designer (e.g. minimal for actuators, maximal for storage sources). It is possible to use any algorithm for optimization under constraints (genetic, gradient method, etc.).

The present invention also provides a DC type electricity network comprising a voltage source powering electrical loads that are connected in parallel to the terminals of the voltage source, each of which is designed to receive a current or power setpoint, the network being characterized in that each load is stabilized by regulating its setpoint by means of a stabilization block having an input connected to means for measuring the voltage at the terminals of the load and an output connected to a terminal for applying the load setpoint via a summing circuit that is also connected to means for issuing a setpoint.

In the invention, a local stabilization block is installed in the regulation loop of each load. The fact that the load has a plurality of stabilization blocks that are local leads to a reduction in the cabling needed for transmitting information (measurements, stabilizing signal reference) compared with incorporating a single stabilization block in the network (for centralized stabilization), which block would then need to be connected to a large number of sensors for delivering all of the measurements to the block. Incorporating local stabilization blocks in the network also makes it possible to reduce the number of sensors involved since only the voltages at the terminals of the loads are needed.

The stabilization block extracts the high frequency component of the voltage, i.e. it must filter out its DC component. By way of example, the filtering may be performed with the help of a lowpass filter and a subtracter, the input of the filter being connected to the above-mentioned measurement means and its output being connected to a subtracter that is for subtracting the filter output signal from the signal coming from the measurement means. In a variant, it is possible to use highpass or bandpass filters.

In an embodiment of the invention, each virtual impedance is generated by a converter powering the load (such as an inverter, a buck circuit, a boost circuit, . . . ) by means of a stabilization block that generates non-linear state feedback and that is forwarded to the converter by being superposed on the setpoint of the corresponding load. The stabilization block is suitable for generating a stabilization signal $p_v(t)$ for superposing on the setpoint of the load in order to raise the threshold for the maximum power that can be consumed by the load beyond which the network is unstable, the stabilization signal being of the type:

$$p_v(t)=v_s(t)\cdot C_v \cdot dv_s/dt$$

or $$p_v(t)=K\cdot v_s^2-X_3$$

in which $v_s$ represents the voltage at the terminals of the power converter controlling the load, $C_v$ and $K$ are parameters defining the virtual stabilization impedance, and $X_3$ is the output signal from a filter having a cutoff frequency $w_c$ that receives the signal $K.v_s^2$ as input, increasing the parameter $C_v$ or $K$ and increasing the stabilization signal, serves to raise the threshold for the maximum power that can be consumed by the load from the network and guarantees stability for the interaction between the load and the network.

The above-defined mathematical model of the electricity network can then be provided with stabilizing state feedback.

The invention also provides transport means such as an aircraft, characterized in that they include a stabilized electricity network as described above.

The invention can be better understood and other details, advantages, and characteristics of the invention appear on reading the following description made by way of non-limiting example and with reference to the accompanying drawings, in which:

Figure 1:
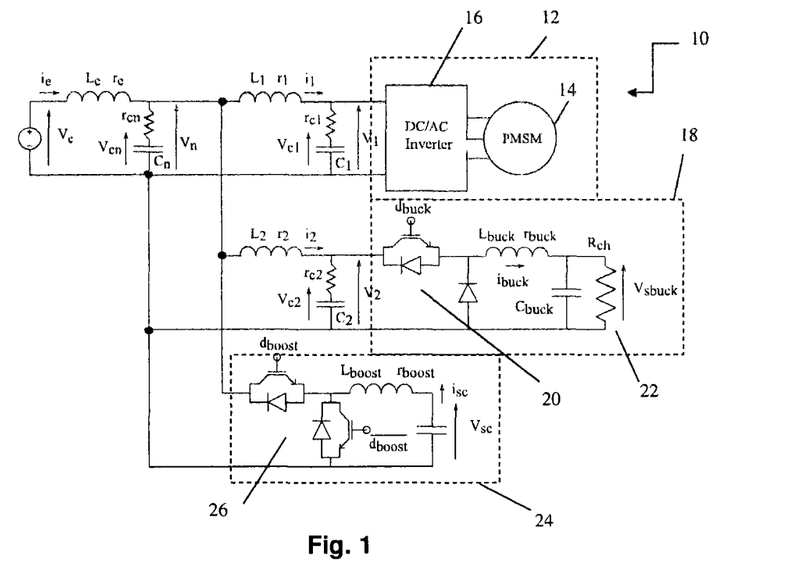
FIG. 1 shows a layout for a DC electricity network having a DC voltage source and three loads.

Reference is made initially to FIG. 1 which shows a DC electricity network 10 suitable for fitting on board transport means such as an aircraft, the network having a DC voltage source 11 with output terminals that are connected in parallel to the input terminals of three different loads.

The first load 12 comprises a permanent magnet synchronous machine 14 (PMSM) powered by a three-phase inverter 16 with torque control via a conventional d-q vector control.

The second load 18 comprises a DC/DC converter 20 powering a single resistance 22, the unit being power regulated so that this provides a load that consumes well-controlled power from the network.

The third load 24 is a super capacitor (SC) that is connected to the network via another DC/DC converter 26 that is electrically bidirectional. The unit is also power regulated. It is thus possible to control exchanges of power between the SC and the network.

The voltage of the DC bus is $v_n$ and the voltages at the terminals of the three loads are respectively $v_1$, $v_2$, and $v_n$.

The DC network or subnetwork of the invention may for example be a unit of the electrical brake actuation controller (EBAC) type, an electrical landing gear system (ELS) subnetwork, or an electrical flight control system (EFCS), a primary distribution unit of the Primes type, etc.

The loads of the network 10 are servo-controlled sufficiently well for it to be possible to assume that they operate at constant power. The input voltage $V_e$ is also assumed to be perfectly constant. The stability of a load may be studied individually before dealing with the situation when all three loads are connected to the network simultaneously. The stability of each load may be studied by studying the Nyquist frequency plots of the open loop transfer functions (OLTFs) of the systems for configurations in cascade (one load). The stability of the overall network (three loads) is assessed by studying the zeros of the denominator of a transfer function, which, for each load, is the transfer function of the ratio of the voltage $v_s$ across the terminals of the load ($v_1$, $v_2$, or $v_n$) over the input voltage $V_e$ ($v_s/V_e$). The results obtained may be confirmed by simulation, as explained below.

As described above, the electrical configurations of the networks may be unstable if the control setpoint (e.g. power) for the loads exceeds a certain threshold. This power limit is defined by the structure of the network and by its content, i.e. by the values of the parameters that make it up. It is known that the values of passive elements such as capacitors, resistors, or inductors vary as a function of several parameters that are not always controllable and/or constant. As an example, consideration may be given to temperature variations or to aging, which act on the electrical properties of the systems. This thus leads to a change to the stability properties of the system that might lead to a state of instability. In order to counter this unwanted phenomenon, the invention proposes defining appropriate commands that generate "stabilizing" signals that are superposed on the reference setpoints for the loads and that thus make it possible to guarantee complete stability for the system or to improve the stability of the system. These signals are advantageously zero under steady conditions in order to avoid disturbing or modifying the setpoints desired by a user or an original operating point.

Changing the setpoint parameters for the loads leads to a change in the operating point of the network. In other words, for each operating point of the network, setpoint parameters are defined for the various loads. For example, an operating point is defined corresponding to $i_q=7$ amps (A), $P_2=500$ watts (W) $P_{sc}=$of 0 W.

Figure 2:
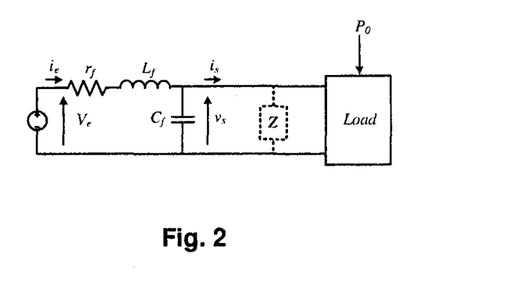
FIG. 2 shows a simplified DC electricity network having a voltage source and a single load that is stabilized actively by creating a virtual impedance Z at its terminals.

The method of the invention makes it possible to over-dimension the passive elements of the network to a smaller extent or not at all by creating a virtual impedance Z (capacitance, resistance, etc.) upstream from each load, thereby enabling the loads and the network as a whole to be stabilized (FIG. 2). The purpose of this virtual impedance is to damp any disturbances that might be generated on the network or at the terminals of the load, and it is "dimensioned" in such a manner as to stabilize the network at the various desired operating points in the various given network configurations, and in the event of at least one of the loads failing (i.e. being deactivated or breaking down).

Figure 3:
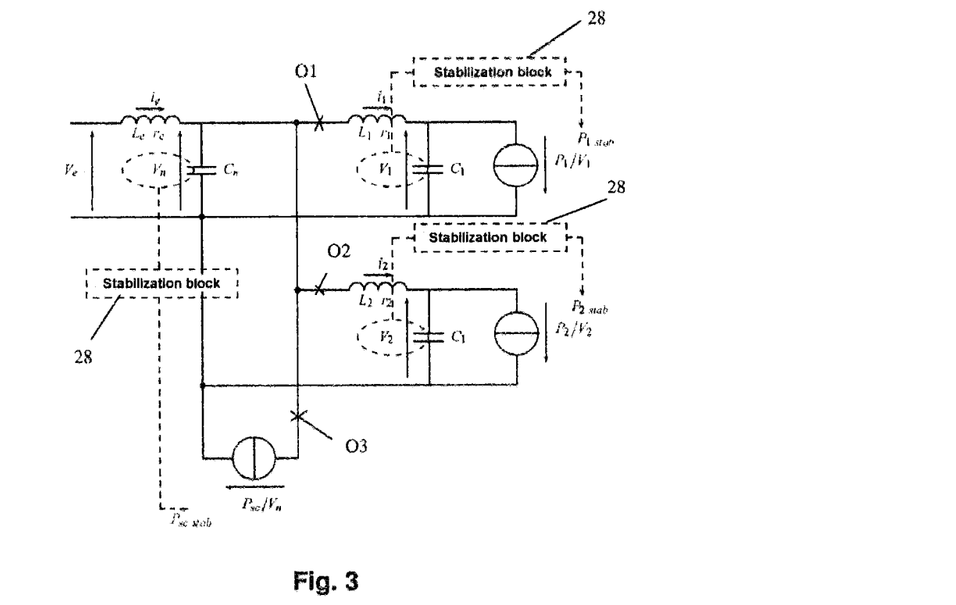
FIG. 3 shows a DC electricity network similar to that of FIG. 1 and comprising three local stabilization blocks for creating virtual impedances for stabilizing the loads.

According to the invention, the stabilizing impedance for each load is generated by a stabilization block 28 (FIG. 3) that acts directly on the setpoint loop of the load in order to control the setpoint and provide stability, in particular by:

adjusting variations in the setpoint between the various requested operating points;

ensuring that the network is stable when at least one of the stabilization blocks is no longer active; and ensuring that the network is stable when at least one of the loads is disconnected (network reconfiguration).

Figure 4A:
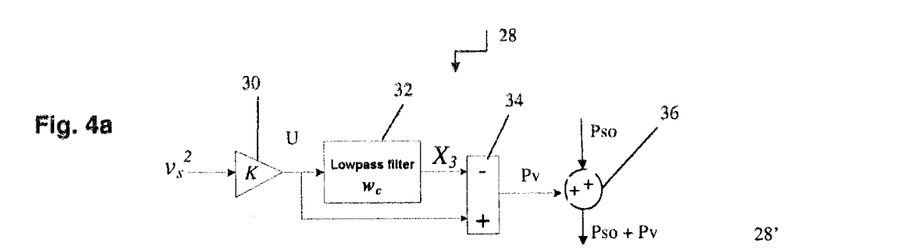
FIGS. 4a and 4b show respective blocks for stabilizing a load of a DC network.

The stabilization block 28 of FIG. 4a serves to generate a virtual resistance at the terminals of a load. The block 28 comprises voltage multiplier means 30 for multiplying the voltage $v_s$ as measured across the terminals of the load by a gain or a correction coefficient K (equivalent to 1/R) that is directly proportional to the amplitude of the stabilizing signal, in order to produce a signal U. The input of a lowpass filter 32 having a cutoff frequency $w_c$ is connected to the output of the means 30, and therefore receives the signal U. The output signal $X_3$ from the filter 32 is subtracted from the signal U by means of a subtracter 34. The output signal $P_v$ from the subtracter 34 is added to the setpoint signal $P_{s0}$ of the load by a summing circuit 36 having its output connected to the load.

The cutoff angular frequency $w_c$ is dimensioned so that only voltage variations are seen by the local stabilizers, the DC components being eliminated. The numerical value selected must incorporate the fact that all of the frequencies adjacent to the resonant frequencies generated by the interconnection filters of the network as a whole must be capable of being taken into account by each local stabilization block. The variant embodiment of the stabilization block 28' shown in FIG. 4b serves to generate a virtual capacitance $C_v$ across the terminals of a load. This block 28' also comprises a lowpass filter 32 having a cutoff frequency $w_c$ that receives as input the DC bus voltage $v_s$ and that provides an output that is written $v_{slf}$. A subtracter 34 serves to subtract the filtered signal $v_{slf}$ from the signal $v_s$. The output signal from the subtracter 34 corresponds to a high frequency oscillation that is multiplied by the angular frequency of the lowpass filter by multiplier means 35 of gain $w_c$. The output signal from the means 35 and the signal $v_{slf}$ are transmitted to additional multiplier means 37 to produce a regulated power signal $p_v$ as a function of the virtual capacitance $C_v$ that is to be generated at the terminals of the load.

The mathematical model for studying the stability of the DC bus voltage of a load such as that shown in FIG. 2 (in which $P_s=P_{s0}$ is the input or setpoint power for the load for an operating point ($i_{e0}$, $v_{s0}$); $P_{s0}=v_{s0} \cdot i_{e0}$ being assumed to be constant) may be expressed as follows:

$$\begin{cases} L_f \cdot \dfrac{d}{dt} i_e = -r_f \cdot i_e - v_s + V_e \\ C \cdot \dfrac{d}{dt} v_s = i_e - \dfrac{P_s}{v_s} \end{cases} \quad (1)$$

where $L_f$ represents an inductance, i.e. represents the current delivered by the voltage source $V_e$, $r_f$ represents a resistance, $v_s$ represents the voltage across the terminals of the load, $v_e$ represents the voltage, C or $C_f$ represents a capacitance that together with the inductance $L_f$ forms an LC filter.

To simplify this model, it is assumed that the control of the load is effective and thus that variations in the DC bus voltage have little or no influence on the controlled currents of the load.

An analysis of the stability of the signal of the load shown in FIG. 2 can be undertaken by studying the poles of the mathematical model that has been locally linearized around the operating point. This leads to the following criteria which give the maximum acceptable load power for a stable operating point:

$$\begin{cases} p_{s0} < p_{s0 \, max} \\ p_{s0 \, max} = r_f \dfrac{C_f}{L_f} v_{s0}^2 \end{cases} \quad (2)$$

where $v_{s0}$ is the voltage across the terminals of the load for the operating point under consideration.

When the power setpoint ($P_{s0}$) of the load reaches $P_{s0max}$, the load is no longer stable. $P_{s0max}$ thus represents a threshold that must not be reached by the setpoint $P_{s0}$. As can be seen from the above equations, $P_{s0max}$ is directly proportional to the capacitance C. Increasing this capacitance, by adding an additional virtual capacitance to the terminals of the load makes it possible to increase the threshold $P_{s0max}$.

In practice, this virtual capacitance is generated by injecting additional power $P_v$ to the power setpoint $P_s$, this additional power satisfying the following equation and representing the load stabilization signal delivered by the stabilization block (when $P_v=0$, the load is not stabilized):

$$p_v(t) = v_s(t) \cdot i_v(t) = v_s(t) \cdot C_v \dfrac{dv_s}{dt} \quad (3)$$

where $C_v$ is the virtual capacitance generated upstream from the load by the stabilization block and $i_v$ is the current passing through the capacitance.

In order to discover the influence of the stabilization block on the impedance, it is necessary to integrate the additional current $i_v$ at the terminals of the load in the above model. To do this, the model incorporates a filtered derivative of the measurement of the DC bus voltage ($v_s$), this model being of the following type:

$$\begin{cases} \dot{x}_1 = -\dfrac{r_f}{L_f} x_1 - \dfrac{x_2}{L_f} \\ \dot{x}_2 = \dfrac{p_{s0} x_2 - C_v w_c v_{s0} (x_3 + v_{s0})(x_2 - x_3)}{C_f v_{s0}(x_2 + v_{s0})} + \dfrac{x_1}{C_f} \\ \dot{x}_3 = w_c (x_2 - x_3) \end{cases} \quad (4)$$

These equations represent the mathematical model of the FIG. 2 network when stabilized by a stabilization block, in which the state variables are as follows:

$$\begin{cases} x_1 = i_e - i_{e_0} \\ x_2 = v_s - v_{s_0} \\ x_3 = v_{slf} - v_{s_0} \end{cases} \quad (5)$$

with the following parameters for the operating point ($i_{s0}$, $v_{s0}$):

$$\begin{cases} i_{e_0} = \dfrac{p_{s0}}{v_{s_0}} \\ v_{s_0} = \dfrac{V_e + \sqrt{V_e^2 + 4p_{s0}r_f}}{2} \end{cases} \quad (6)$$

and in which, for a first order filter, $v_{sif}$ is an additional state variable.

The above-mentioned state variables $x_1$, $x_2$, and $x_3$ are functions of measurable physical parameters of the network or of network data.

To stabilize the load, it is also possible to propose the following stabilization relationship, in which K is the correction coefficient (1/K represents a virtual resistance, K being equivalent to 1/R) to be defined for stabilizing the load:

$$U = K \cdot v_s^2 \text{ and } p_v(t) = v_s^2 - X_3$$

(cf. FIG. 4a), where $p_v(t) = K \cdot v_s^2 - X_3$ represents the signal for stabilizing a load in the FIG. 4a configuration for a large signal, this signal being expressed in the form K.f(x) around a given operating point.

The determination of the parameters K depends in particular on the architecture of the network and on the number of active loads in the network. These parameters are determined firstly by solving the set of matrices that define a network, and secondly as a function of the various desired operating points, the various possible configurations, and criteria for minimizing the influence of dynamic performance on the loads.

Figure 4B:
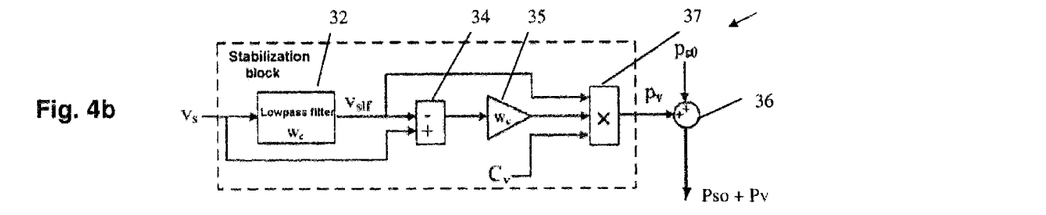

The stabilization relationship incorporates damping of the signal and takes account of the fact that undamped oscillations should disappear. Because this damping is necessary only around an operating point, it may be followed by a suitable filter, e.g. a lowpass filter, as shown in FIGS. 4a and 4b.

The network of FIG. 3 is modelled and linearized at a given operating point. This network corresponds to the network of FIG. 1 with stabilization blocks of the invention added thereto, each block serving to regulate the control setpoint for the load with which it is associated in such a manner as to stabilize it within the network.

The linear mathematical model of the DC network may be defined by the following matrix ($M_{sound}$) in which the parameters $K_1$, $K_2$, and $K_{sc}$ represent respectively the correction coefficients of the first, second, and third load.

A target function is determined for stabilizing the network as a function of constraints that are described in greater detail below. This target function may be expressed by the following equation:

$$f_{min}(K_1, K_2, K_{sc}) = K_1 + K_2 + \dfrac{1}{K_{sc}}$$

The constraints serve to guarantee stability for the system. They are imposed on the real parts of the eigenvalues $\lambda$ of the state matrices of the system in its various configurations. The constraints are valid locally around an operating point, and the stability of all of the operating points corresponding to a domain D given by two power ranges is investigated, the ranges being defined by the following relationship:

$$\begin{cases} D \in \mathcal{R}^2, I_1 \in \mathcal{R}, I_2 \in \mathcal{R} \\ I_1 = [0, P_{1max}] \text{ and } I_2 = [0, P_{2max}] \\ D = I_1 \times I_2 \end{cases}$$

with this being done for the following circumstances:

a) at least two out of the three stabilizers are active (possibility of failure of one of the three); and b) disconnection of one of the branches of the system (automatic disconnection for safety).

In the failure scenarios, account is thus taken of the event and what it implies for the system by the algorithm in charge of optimization, which algorithm, if it manages to converge, serves to dimension the stabilization blocks that ensure stability for all of the circumstances under consideration. It should be recalled that ensuring local stability for all of the operating points of a domain does not correspond to ensuring large signal stability over that domain.

Other constraints to be taken into account relate to situations in which the network is reconfigured, e.g. in the event of a failure in a branch of the network.

The following matrix $M_{failure1}$ is a mathematical model of the network in the event of one branch of the first load being open, e.g. at the point O1 in FIG. 3.

$$\begin{bmatrix} \dot{x}_1(t) \\ \dot{x}_2(t) \\ \dot{x}_3(t) \\ \dot{x}_4(t) \\ \dot{x}_5(t) \\ \dot{x}_6(t) \\ \dot{x}_7(t) \\ \dot{x}_8(t) \\ \dot{x}_9(t) \end{bmatrix} = \underbrace{\begin{bmatrix} \dfrac{-r_e}{L_e} & 0 & 0 & \dfrac{-1}{L_e} & 0 & 0 & 0 & 0 & 0 \\ 0 & \dfrac{-r_1}{L_1} & 0 & \dfrac{1}{L_1} & \dfrac{-1}{L_1} & 0 & 0 & 0 & 0 \\ 0 & 0 & \dfrac{-r_2}{L_2} & \dfrac{1}{L_2} & 0 & \dfrac{-1}{L_2} & 0 & 0 & 0 \\ \dfrac{1}{C_n} & \dfrac{-1}{C_n} & \dfrac{-1}{C_n} & \dfrac{P_{sc}}{v_{n0}^2 C_n} - \dfrac{2K_{sc}}{C_n} & 0 & 0 & \dfrac{1}{C_n v_{n0}} & 0 & 0 \\ 0 & \dfrac{1}{C_1} & 0 & 0 & \dfrac{P_1}{v_{10}^2 C_1} - 2\dfrac{K_1}{C_1} & 0 & 0 & \dfrac{1}{C_1 v_{10}} & 0 \\ 0 & 0 & \dfrac{1}{C_2} & 0 & 0 & \dfrac{P_2}{v_{20}^2 C_2} - 2\dfrac{K_2}{C_2} & 0 & 0 & \dfrac{1}{C_2 v_{20}} \\ 0 & 0 & 0 & 2K_{sc} V_{n0} w_{sc} & 0 & 0 & -w_{sc} & 0 & 0 \\ 0 & 0 & 0 & 0 & 2K_1 V_{10} w_1 & 0 & 0 & -w_1 & 0 \\ 0 & 0 & 0 & 0 & 0 & 2K_2 V_{20} w_2 & 0 & 0 & -w_2 \end{bmatrix}}_{M_{sound}} \begin{bmatrix} \tilde{x}_1(t) \\ \tilde{x}_2(t) \\ \tilde{x}_3(t) \\ \tilde{x}_4(t) \\ \tilde{x}_5(t) \\ \tilde{x}_6(t) \\ \tilde{x}_7(t) \\ \tilde{x}_8(t) \\ \tilde{x}_9(t) \end{bmatrix} \quad (2.1)$$

$$\begin{bmatrix} \dot{\tilde{x}}_1(t) \\ \dot{\tilde{x}}_3(t) \\ \dot{\tilde{x}}_4(t) \\ \dot{\tilde{x}}_6(t) \\ \dot{\tilde{x}}_7(t) \\ \dot{\tilde{x}}_9(t) \end{bmatrix} = \underbrace{\begin{bmatrix} \frac{-r_e}{L_e} & 0 & \frac{-1}{L_e} & 0 & 0 & 0 \\ 0 & \frac{-r_2}{L_2} & \frac{1}{L_2} & \frac{-1}{L_2} & 0 & 0 \\ \frac{1}{C_n} & \frac{-1}{C_n} & \frac{P_{sc}}{v_{n0}^2 C_n} - 2\frac{K_{sc}}{C_n} & 0 & \frac{1}{C_n v_{n0}} & 0 \\ 0 & \frac{1}{C_2} & 0 & \frac{P_2}{v_{20}^2 C_2} - 2\frac{K_2}{C_2} & 0 & \frac{1}{C_2 v_{20}} \\ 0 & 0 & 2K_{sc}V_{n0}w_{sc} & 0 & -w_{sc} & 0 \\ 0 & 0 & 0 & 2K_2 V_{20} w_2 & 0 & -w_2 \end{bmatrix}}_{M_{failure1}} \begin{bmatrix} \tilde{x}_1(t) \\ \tilde{x}_3(t) \\ \tilde{x}_4(t) \\ \tilde{x}_6(t) \\ \tilde{x}_7(t) \\ \tilde{x}_9(t) \end{bmatrix}$$

The following matrix $M_{failure2}$ is a mathematical model of the network in the event of a branch of the second load being open, e.g. at point O2 in FIG. 3.

$$\begin{bmatrix} \dot{\tilde{x}}_1(t) \\ \dot{\tilde{x}}_2(t) \\ \dot{\tilde{x}}_4(t) \\ \dot{\tilde{x}}_5(t) \\ \dot{\tilde{x}}_7(t) \\ \dot{\tilde{x}}_8(t) \end{bmatrix} = \underbrace{\begin{bmatrix} \frac{-r_e}{L_e} & 0 & \frac{-1}{L_e} & 0 & 0 & 0 \\ 0 & \frac{-r_1}{L_1} & \frac{1}{L_1} & \frac{-1}{L_1} & 0 & 0 \\ \frac{1}{C_n} & \frac{-1}{C_n} & \frac{P_{sc}}{v_{n0}^2 C_n} - 2\frac{K_{sc}}{C_n} & 0 & \frac{1}{C_n v_{n0}} & 0 \\ 0 & \frac{1}{C_1} & 0 & \frac{P_1}{v_{10}^2 C_1} - 2\frac{K_1}{C_1} & 0 & \frac{1}{C_1 v_{10}} \\ 0 & 0 & 2K_{sc}V_{n0}w_{sc} & 0 & -w_{sc} & 0 \\ 0 & 0 & 0 & 2K_1 V_{10} w_1 & 0 & -w_1 \end{bmatrix}}_{M_{failure2}} \begin{bmatrix} \tilde{x}_1(t) \\ \tilde{x}_3(t) \\ \tilde{x}_4(t) \\ \tilde{x}_5(t) \\ \tilde{x}_7(t) \\ \tilde{x}_8(t) \end{bmatrix}$$

The following matrix $M_{failuresc}$ is a mathematical model of the network in the event of a branch of the third load being open, e.g. at point O3 in FIG. 3.

$$\begin{bmatrix} \dot{\tilde{x}}_1(t) \\ \dot{\tilde{x}}_2(t) \\ \dot{\tilde{x}}_3(t) \\ \dot{\tilde{x}}_4(t) \\ \dot{\tilde{x}}_5(t) \\ \dot{\tilde{x}}_6(t) \\ \dot{\tilde{x}}_7(t) \\ \dot{\tilde{x}}_8(t) \\ \dot{\tilde{x}}_9(t) \end{bmatrix} = \underbrace{\begin{bmatrix} \frac{-r_e}{L_e} & 0 & 0 & \frac{-1}{L_e} & 0 & 0 & 0 & 0 \\ 0 & \frac{-r_1}{L_1} & 0 & \frac{1}{L_1} & \frac{-1}{L_1} & 0 & 0 & 0 \\ 0 & 0 & \frac{-r_2}{L_2} & \frac{1}{L_2} & 0 & \frac{-1}{L_2} & 0 & 0 \\ \frac{1}{C_n} & \frac{-1}{C_n} & \frac{-1}{C_n} & 0 & 0 & 0 & 0 & 0 \\ 0 & \frac{1}{C_1} & 0 & 0 & \frac{P_1}{v_{10}^2 C_1} - 2\frac{K_1}{C_1} & 0 & \frac{1}{C_1 v_{10}} & 0 \\ 0 & 0 & \frac{1}{C_2} & 0 & 0 & \frac{P_2}{v_{20}^2 C_2} - 2\frac{K_2}{C_2} & 0 & \frac{1}{C_2 v_{20}} \\ 0 & 0 & 0 & 0 & 2K_1 V_{10} w_1 & 0 & -w_1 & 0 \\ 0 & 0 & 0 & 0 & 0 & 2K_2 V_{20} w_2 & 0 & -w_2 \end{bmatrix}}_{M_{failuresc}} \begin{bmatrix} \tilde{x}_1(t) \\ \tilde{x}_2(t) \\ \tilde{x}_3(t) \\ \tilde{x}_4(t) \\ \tilde{x}_5(t) \\ \tilde{x}_6(t) \\ \tilde{x}_7(t) \\ \tilde{x}_8(t) \\ \tilde{x}_9(t) \end{bmatrix}$$

In order to incorporate a robustness criterion, the real parts of the eigenvalues of the matrices $M_{sound}$, $M_{failure1}$, $M_{failuresc}$, and $M_{failure2}$ are required to be less than a strictly negative value written RM. This provides a safety margin for taking account of possible variations or inaccuracies in the parameter values. Finally, the constraints to be satisfied are given by the following relationship:

$$\begin{cases} g_1 = \max\{\mathcal{R}(\lambda M_{sound})\} + RM \\ g_2 = \max\{\mathcal{R}(\lambda M_{sound, K_1=0})\} + RM \\ g_3 = \max\{\mathcal{R}(\lambda M_{sound, K_2=0})\} + RM \\ g_4 = \max\{\mathcal{R}(\lambda M_{sound, K_{sc}=0})\} + RM \\ g_5 = \max\{\mathcal{R}(\lambda M_{failure\ 1})\} + RM \\ g_6 = \max\{\mathcal{R}(\lambda M_{failure\ 2})\} + RM \\ g_7 = \max\{\mathcal{R}(\lambda M_{failure\ sc})\} + RM \end{cases}$$

Any other constraint expressed in the form of equations may be taken into account in the algorithm.

Linearizing the system makes it possible to define the eigenvalues of the system by acting on the various values of K, the real parts of each pole being made negative (which guarantees stability in the domain close to the linearization point), and are advantageously made to be less than −5 in order to increase the robustness margins of the system.

Thereafter, e.g. as a function of various desired operating points, of various possible configurations, and of criteria for minimizing the influence of dynamic performance on the loads, the various values of K satisfying all of these criteria are determined in order to ensure that the network is stable.

Figure 5:
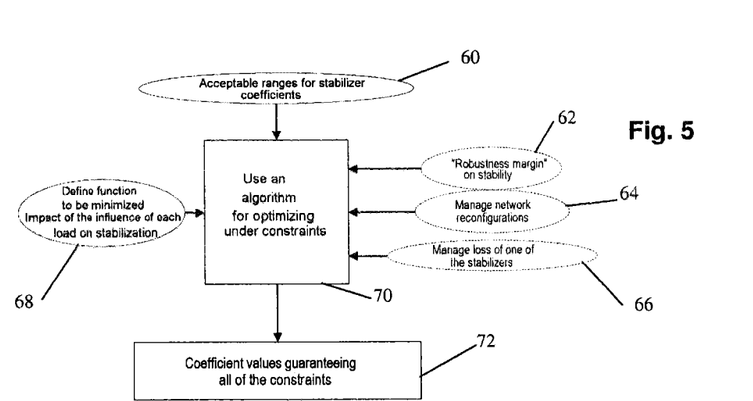
FIGS. 5 and 6 are block diagrams showing the steps of the method of the invention.

FIG. 5 is a highly diagrammatic representation of the steps of the method of the invention for determining correction coefficients that are applied to the setpoints of the loads in order to stabilize them within the DC network. This figure shows the constraints that may be taken into account for defining the correction coefficients.

In the example shown, the constraints taken into account are as follows:

a) acceptable ranges for the coefficients K of the stabilization blocks (block 60);

b) a robustness margin for the stability of each load (block 62);

c) managing reconfigurations of the network (block 64); and d) managing the loss of one of the stabilization blocks (block 66).

The network model as established above serves to define the target function that is to be minimized and to assess the impact of each load on stabilization (block 68).

Modeling the network, its operating points, and its desired acceptable degraded modes, makes it possible to define a set of equations enabling a single set of values to be defined for the coefficients ($K_1$ to $K_n$). The advantage of such a unique solution is that it enables the defined values to be robust and unique for all the desired situations that are taken into account in the modeling and in the system of equations.

An optimization algorithm is then used and iterated in order to find the best values of K that satisfy the optimization criteria (blocks 70 and 72). The calculation and optimization algorithm is not specific and may for example be the Matlab fmincon function which solves and optimizes the set of equations. This makes it possible to define values for the above-mentioned correction coefficients K.

The target of decentralized or multi-block stabilization is to provide coherent dimensioning of the stabilization blocks so as to ensure that the system is stable in a plurality of circumstances. In order to achieve this target, use is made of a method of optimization under constraints. With such an approach, it is possible to take account of constraints on the stability of the system. By way of example, these may be robustness margins, tolerance to failures of the stabilizers, and managing possible reconfigurations of the system in the event of a failure in one of the loads of the network. In addition, as a function for minimizing, use is made of a relationship associating all of the stabilization blocks with their impact on their respective loads.

Which optimization algorithm is selected is transparent to the problem. In other words, the advantage of the presently-proposed method lies in defining the problem. It is then solved with the help of whatever algorithm is selected for optimization under constraints. In this example, the method used is the Matlab fmincon function available in the "optimization toolbox". It is based on minimizing the target function to which the weighted coefficient constraints are added. The coefficients weighting the constraints ensure that the minimum of the new function as defined in this way cannot correspond to solutions that do not satisfy the constraints.

The optimization is based on the linear models ($M_{sound}$, $M_{failure1}$, $M_{failuresc}$, and $M_{failure2}$) corresponding to the various possible scenarios in the above-described scenario.

The impedances are determined by defining and solving a problem of optimization under constraints. The impedances are the solution to the problem of optimization under constraints. They correspond to the coefficients K and Cv.

Figure 6:
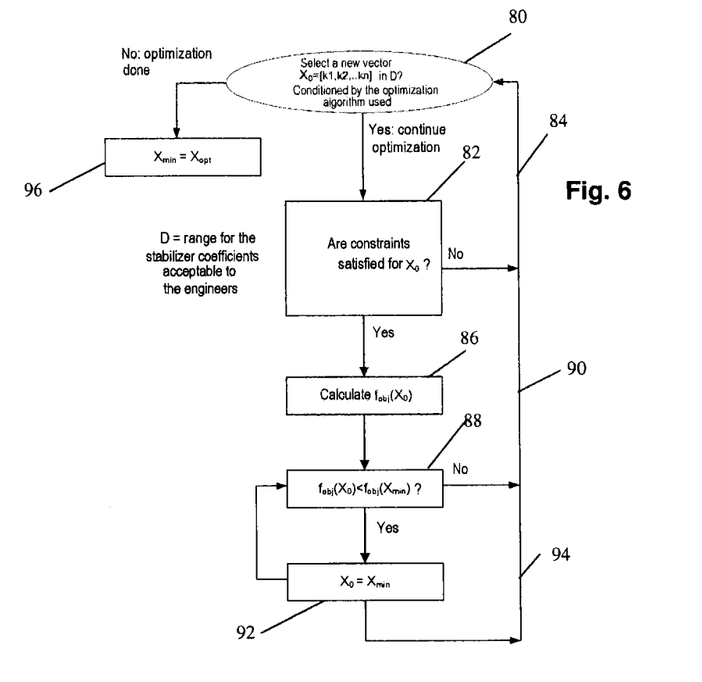

FIG. 6 shows diagrammatically the steps of the optimization method of the invention.

A user begins by determining a domain D in which the correction coefficients K are to be determined. The optimization algorithm defines a vector $X_0$ in this domain, which vector comprises a set of load correction coefficients (block 80). In the present example of a DC network having three loads, $X_0=[K_1, K_2,$ and $K_{sc}]$, the optimization algorithm begins by verifying that all of the above-mentioned constraints are satisfied for the vector $X_0$ (block 82). If the constraints are not satisfied, the algorithm defines a new vector (84, 80). On the contrary, if all of the constraints are satisfied, the algorithm calculates the target function with the vector $X_0$ (block 86) and then compares the results obtained with a result for the same function when the vector used is as small as possible, i.e. when the correction coefficients that make it up are as small as possible (block 88). If the target (or "objective") function $f_{obj}(X_0)$ is greater than or equal to $f_{obj}(X_{min})$ (branches 90, 84), then the algorithm calculates a new vector and reiterates the steps of blocks 80, 82, and 86. When the target function $f_{obj}(X_0)$ is less than $f_{obj}(X_{min})$, and $X_0$ is equal to $X_{min}$, i.e. the vector is the smallest possible vector (block 92), then optimization has terminated (branch 94) and the identified vector may be considered as being the optimization vector ($X_0=X_{min}=X_{opt}$, block 96), this optimization vector comprising the optimum correction coefficients $K_1$, $K_2$, and $K_{sc}$ for stabilizing all of the loads and the DC network.

In order to put a multiblock stabilization system into place, the main step consists in obtaining the coefficient values K that satisfy the constraints that have been set. For this purpose, the above-defined problem of optimization under constraints has been adapted to the formatting requested by the Matlab fmincon function, as set out below:

X=fmincon($f_{min}$, $x_0$, A, B, $A_{eq}$, $b_{eq}$, $x_{min}$, $x_{max}$, $NL_{con}$)

$f_{min}$: target function $x_0$: starting point of optimization

A and b: inequality constraint A.x≤b $A_{eq}$ and $b_{eq}$: equality constraint $A_{eq}.x=b_{eq}$ $x_{min}$ and $x_{max}$: definition ranges for x $NL_{con}$: non-linear inequality and equality constraints.

For the problem described herein, only the non-linear constraints ($NL_{con}$) are described. They are defined in a Matlab file that determines the eigenvalues of the matrices $M_{sound}$, $M_{failure1}$, $M_{failuresc}$ for the circumstances under consideration and that proposes constraints as defined above to the optimization algorithm.

The vectors $x_{min}$ and $x_{max}$ define the maximum and minimum values that can be taken by the coefficients K. In this example, for the three coefficients, the value of the virtual resistance (corresponding to 1/K) is set to lie in the range infinite (no damping) to 1. The following definitions thus apply: $x_{min}=0$ and $x_{max}=1$.

The starting point $x_0$ for optimization is chosen so as to place the initial value for the virtual resistance of each stabilization block at 20, i.e.:

$$x_0=[0.05\ 0.05\ 0.05]^t$$

The robustness margin (RM) is taken to be equal to 5.

When choosing the coefficients $a_i$ that define the target function to be minimized, $a_{sc}$ is taken to have a negative sign and $a_1=a_2$ are taken to have a positive sign so as to have $f_{min}$ in the following form:

$$f_{min},(K_1,K_2,K_{sc})=-|a_{sc}|K_{sc}+|a_1|(K_1+K_2)\ |a_{sc}|+2|a_1|=1$$

This makes it possible to give precedence to "large" values of $K_{sc}$ and conversely to search for the smallest possible values for $K_1$ and $K_2$. The ratio $r_{opt}=a_1/a_{sc}$ serves to weight the optimization effort. The greater this ratio, the smaller the coefficients for the loads 1 and 2.

The results of the optimization (as a function of the ratio $r_{opt}$ for the power ranges $P_1 \in [0, 700\ W]$ and $P_2 \in [0, 500\ W]$ have shown that $K_{sc}$ is indeed always greater than $K_1$ and $K_2$, thus confirming the sign choices for the coefficients. Thereafter, it can be seen that the value of $K_1$ varies very little with $r_{opt}$. This is due to the constraint given to the situation in which the stabilizer of the load 2 has failed. In that situation, only the load 1 and the SC can stabilize the bus. However, given the structure of the network, it is shown above that the stabilizer of the SC has only limited impact on the shifting of certain eigenvalues. Under such circumstances, the load 1 must therefore perform the major part of stabilization, and it is this that sets the value of the coefficient $K_1$. For the other coefficients, it can be seen that they decrease as the value of $r_{opt}$ is lowered. For $r_{opt}<0.06$, the algorithm no longer converges.

In the particular implementation of the invention described above, and using the above equations, the following coefficients are selected that terminate the dimensioning of the multiblock stabilization system:

$K_{sc}=0.084$
$K_1=0.008$
$K_2=0.0535$

The effectiveness with which the complete DC network is stabilized can be verified by simulation and by experiment. To do this, it is possible to develop a Simulink model of the network. The curves of FIGS. 7 to 9 were obtained by experiment.

Figure 7:
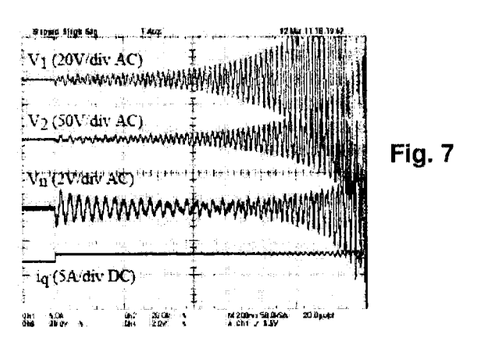
FIG. 7 is a graph showing how the DC bus voltage varies for the three loads of the FIG. 1 network in response to a power step, when the three loads are not stabilized.

FIG. 7 is a graph showing how the DC bus voltage ($v_1, v_2,$ and $v_n$) varies on the three loads of the FIG. 1 network in response to a power step, when the three loads are not stabilized. It can be seen that following the power step, the oscillations of the signals do not stabilize. On the contrary, their amplitudes increase. When the eigenvalues of the transfer function $v_n/V_e$ for each load are studied, it is found that at least some of the zeros of the denominator of the transfer function have a positive real part, thereby demonstrating the instability of the system.

Figure 8:
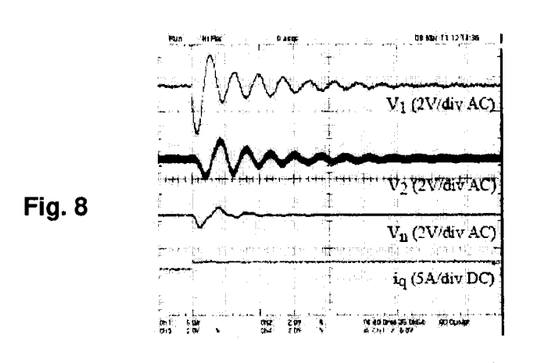
FIGS. 8 and 9 are graphs showing how the DC bus voltage varies for the three loads of the FIG. 3 network in response to a power step, when the three loads are stabilized as shown in FIG. 8, and when only two of the loads are stabilized, with the stabilizing function of one of the loads having failed in the example of FIG. 9.

FIG. 8 is a graph showing how the DC bus voltage ($v_1, v_2,$ and $v_n$) on the three loads of the FIG. 1 network varies in response to a power step, when the three loads are stabilized by the method of the invention. Unlike the preceding figure, the oscillations in the signals stabilize and their amplitudes decrease over time, in responses to a power step. The DC network is thus stabilized.

When the eigenvalues of the transfer functions $v_n/V_e$ for each of the loads are studied, it can be seen that the zeros of the denominator of each transfer function all have a real part that is negative, thus demonstrating the stability of the network when all three branches are operating simultaneously.

Figure 9:
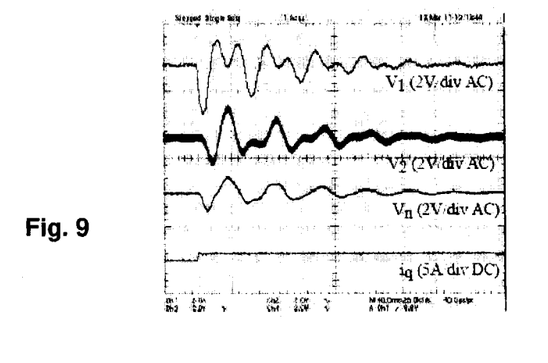

FIG. 9 is a graph corresponding to FIG. 8, but in which the stabilization block for the load SC has failed and no longer performs stabilization. It can still be seen that the oscillations of the signals stabilize and that their amplitudes diminish over time in response to a power step. The DC network thus remains stabilized in spite of one of the stabilization blocks being deactivated.

These results confirm the stabilizing impact of the proposed method. It can be seen that with the various stabilization blocks of the system being dimensioned once only, it is possible to ensure that the network is stable even in the event of one of the blocks failing or of the network being reconfigured. This is confirmed all the more by the fact that the scenarios that have not been included in the optimization constraints are unstable. The multi-block system then cannot provide stability for the system in the event of the constraints associated with the corresponding scenario not being taken into account during the optimization.

The appearances observed on the results of simulation are still present in experimental testing. It has been found that the most constraining scenario (the scenario for which the response of the system is damped the least) is what happens when the stabilizer 1 breaks down. Conversely, the least constraining scenario is what happens when the stabilizer of the SC fails.

The invention claimed is:

1. A method of stabilizing a DC electricity network, the DC electricity network including a DC voltage source powering electrical loads that are connected in parallel to terminals of the DC voltage source, each electrical load to receive a power setpoint, the method comprising:

stabilizing the DC electricity network by regulating the power setpoints applied to the respective electrical loads by virtual stabilization impedances each generated at terminals of each respective electrical load, the virtual stablization impedances being dimensioned to stabilize the DC electricity network in desired operating points and in given configurations of the DC electricity network including a state in which at least one electrical load of the electrical loads is inactive or has failed and a state in which stabilization of an electrical load of the electrical loads is inactive, any one of said virtual stabilization impedances being generated at the terminals of one of said electrical loads by a stabilization block of a non-linear regulation loop that acts on the power setpoint of said one of the electrical loads and that generates a stabilization signal $p_v(t)$ for superposing to said power setpoint of said one of the electrical loads, the stabilization signal being so that:

$$p_v(t)=v_s(t)\cdot C_v\cdot dv_s/dt$$

or $$p_v(t)=K\cdot v_s^2-X_3$$

in which:

$v_s$ represents a DC voltage at the terminals of said one of the electrical loads, $C_v$ and K are parameters defining the virtual stabilization impedance, and $X_3$ is an output signal from a filter of cutoff frequency $w_c$ that receives the signal $K\cdot v_s^2$ as input.

2. The method according to claim 1, wherein any one of the non-linear regulation loops acting on the power setpoint of said one of the electrical loads uses a non-linear regulation relationship generating an output signal of type K·f(x), wherein x is a control variable for said one of the electrical loads and K is a correction coefficient specific to said one of the electrical loads, said correction coefficient being determined by performing the steps consisting in:
- (a) defining a mathematical model of the DC electricity network, said mathematical model comprising equations including said correction coefficient for ensuring stability of the electrical loads and of the DC electricity network;
- (b) defining constraints to be satisfied so that the DC electricity network remains stable, or remains stable in event of the DC electricity network being reconfigured or in event of a failing of at least one electrical load of the electrical loads;
- (c) determining an optimum vector ($X_O$) of the correction coefficients by an optimization algorithm for verifying that a given vector satisfies constraints and for calculating a target function for stabilizing the optimum vector; and
- (d) repeating operations (a)-(c) until obtaining a vector that satisfies the constraints and that has smallest possible correction coefficients.

3. The method according to claim 2, wherein the constraints to be satisfied include acceptable ranges of values for the correction coefficients and for maintaining stabilization in event of:
- the DC electricity network being reconfigured,
- a failure in the stabilization of at least one electrical load of said electrical loads, and
- given variations or inaccuracies in parametric values specific to the DC electricity network.

4. The method according to claim 2, wherein the mathematical model includes equations characterizing the DC electricity network in absence of at least one electrical load of the electrical loads and/or in absence of stabilization for at least one electrical load of the electrical loads.

5. The method according to claim 2, wherein the optimization algorithm serves to compare a calculation of a target function using a vector with a calculation of a same function using another vector in which the correction coefficients are the smallest possible, and then in repeating operation (a)-(c) until the vector under consideration is identical to the vector having the smallest possible coefficients.

6. A DC electricity network comprising:
- a DC voltage source powering electrical loads that are connected in parallel to terminals of the DC voltage source and each of the electrical loads is to receive a power setpoint;
- the DC electricity network being stabilized by regulating power setpoints applied to the electrical loads by stabilization blocks installed in non-linear regulation loops, each of the stabilization blocks configured to generate a virtual stabilization impedance for an electrical load of the electrical loads and including an input connected to means for measuring voltage at terminals of the corresponding electrical load and an output connected to a terminal for applying the power setpoint of the electrical load by a summing circuit, wherein
- the virtual stabilization impedances are dimensioned to stabilize the DC electricity network in desired operating points and in given configurations of the DC electricity network including a state in which at least one electrical load is inactive or has failed and a state in which stabilization of corresponding each of the electrical loads is inactive, any one of said virtual stabilization impedances being generated at the terminals of one of the electrical loads by a stabilization block of a non-linear regulation loop that acts on the power setpoint of the corresponding electrical load and generates a stabilization signal $p_v(t)$ for superposing to the power setpoint of said one of the electrical loads, the stabilization signal being so that:

$$p_v(t)=v_s(t)\cdot C_v\cdot dv_s/dt$$

or $$p_v(t)=K\cdot v_s^2-X_3$$

where:
- $v_s$ represents a DC voltage at the terminals of said one of the electrical loads, $C_v$ and K are parameters defining the virtual stabilization impedance, and $X_3$ is an output signal from a filter of cutoff frequency $w_c$ that receives the signal $K\cdot v_s^2$ as input.

7. The DC electricity network of claim 6, wherein the stabilization block comprises a lowpass filter and a subtractor, an input of the lowpass filter being connected to the means for measuring and its output being connected to the subtractor for subtracting a filter output signal from a signal coming from the means for measuring.

8. A transport means comprising the DC electricity network according to claim 6.

9. A method of stabilizing a DC electricity network, the DC electricity network having a DC voltage source powering electrical loads that are connected in parallel to the terminals of the DC voltage source, each electrical load to receive a power setpoint, the method comprising:
- stabilizing the DC electricity network by regulating the power setpoints applied to the respective electrical loads by virtual stabilization impedances each generated at the terminals of each respective electrical load, the virtual stabilization impedances being dimensioned to stabilize the DC electricity network in desired operating points and in given configurations of the DC electricity network including a state in which at least one electrical load of the electrical loads is inactive or has failed and a state in which stabilization of an electrical load of the electrical loads is inactive, any one of said virtual stabilization impedances being generated at the terminals of one of said electrical loads by a stabilization block of a non-linear regulation loop that acts on the power setpoint of said one of the electrical loads and that generates a stabilization signal $p_v(t)$ for superposing to said power setpoint of said one of the electrical loads, the stabilization signal of at least one of the stabilization blocks being so that:

$$p_v(t)=v_s(t)\cdot C_v\cdot dv_s/dt$$

and the stabilization signal of at least one of the stabilization blocks being so that:

$$p_v(t)=K\cdot v_s^2-X_3$$

where $v_s$ represents a DC voltage at the terminals of said one of the electrical loads, $C_v$ and K are parameters defining the virtual stabilization impedance, and $X_3$ is an output signal from a filter of cutoff frequency $w_c$ that receives the signal $K\cdot v_s^2$ as input.

* * * * *

UNITED STATES PATENT AND TRADEMARK OFFICE
CERTIFICATE OF CORRECTION

PATENT NO. : 10,128,652 B2
APPLICATION NO. : 14/344760
DATED : November 13, 2018
INVENTOR(S) : Sebastien Vieillard et al.

Page 1 of 1

It is certified that error appears in the above-identified patent and that said Letters Patent is hereby corrected as shown below:

In the Specification

In Column 2, Line 63, delete "C," and insert --$C_v$--, therefor.

In Column 12, Line 15, delete "$\tilde{x}_3(t)$" and insert --$\tilde{x}_2(t)$--, therefor.

Signed and Sealed this
Seventeenth Day of December, 2019

Andrei Iancu
*Director of the United States Patent and Trademark Office*